(12) United States Patent
Li et al.

(10) Patent No.: US 10,115,744 B2
(45) Date of Patent: Oct. 30, 2018

(54) ARRAY SUBSTRATE AND FABRICATION METHOD, DISPLAY PANEL, AND DISPLAY DEVICE

(71) Applicants: Shanghai Tianma AM-OLED Co., Ltd., Shanghai (CN); Tianma Micro-electronics Co., Ltd., Shenzhen (CN)

(72) Inventors: Qi Li, Shanghai (CN); Dong Qian, Shanghai (CN); Duzen Peng, Shanghai (CN)

(73) Assignees: Shanghai Tianma AM-OLED Co., Ltd., Shanghai (CN); Tianma Micro-electronics Co., Ltd., Shenzhen (CN)

(*) Notice: Subject to any disclaimer, the term of this patent is extended or adjusted under 35 U.S.C. 154(b) by 15 days.

(21) Appl. No.: 15/186,869

(22) Filed: Jun. 20, 2016

(65) Prior Publication Data
US 2017/0287947 A1    Oct. 5, 2017

(30) Foreign Application Priority Data
Mar. 31, 2016  (CN) .......................... 2016 1 0200728

(51) Int. Cl.
*H01L 27/12*    (2006.01)
*H01L 29/786*   (2006.01)
(Continued)

(52) U.S. Cl.
CPC .... *H01L 27/1244* (2013.01); *G02F 1/133514* (2013.01); *G02F 1/136227* (2013.01);
(Continued)

(58) Field of Classification Search
CPC .......... G02F 1/13629; G02F 1/136213; G02F 1/136227; G02F 1/136286; H01L 23/5226;
(Continued)

(56) References Cited

U.S. PATENT DOCUMENTS

2004/0113190 A1* 6/2004 Oh .................... H01L 21/76801
                                                            257/296
2006/0273715 A1* 12/2006 Yang .................. H01L 27/3248
                                                            313/504
(Continued)

FOREIGN PATENT DOCUMENTS

CN       1507045 A      6/2004
CN     101359647 A      2/2009
(Continued)

*Primary Examiner* — Matthew Reames
*Assistant Examiner* — John Bodnar
(74) *Attorney, Agent, or Firm* — Anova Law Group, PLLC

(57) ABSTRACT

The present disclosure provides an array substrate, including a substrate, a first functional layer configured on one side of the substrate, a first insulating layer configured on the first functional layer facing away from the substrate, a second functional layer configured on the first insulating layer facing away from the substrate, a second insulating layer configured on the second functional layer facing away from the substrate, a third functional layer configured on the second insulating layer facing away from the substrate, a third insulating layer configured on the third functional layer facing away from the substrate, a fourth functional layer configured on the third insulating layer facing away from the substrate, and a plurality of through-holes configured to electrically connect different functional layers, wherein the depth of any through-holes does not exceed the thickness of two adjacent insulating layers.

16 Claims, 11 Drawing Sheets

(51) Int. Cl.
  *G02F 1/1362* (2006.01)
  *G02F 1/1335* (2006.01)
  *H01L 27/32* (2006.01)
  *G02F 1/1368* (2006.01)

(52) U.S. Cl.
  CPC ........ *H01L 27/127* (2013.01); *H01L 27/1222* (2013.01); *H01L 27/1255* (2013.01); *H01L 27/1288* (2013.01); *H01L 29/78675* (2013.01); *G02F 2001/13685* (2013.01); *H01L 27/3262* (2013.01)

(58) Field of Classification Search
  CPC ............. H01L 23/5283; H01L 23/5223; H01L 27/1255; H01L 27/124
  See application file for complete search history.

(56) References Cited

U.S. PATENT DOCUMENTS

2008/0225190 A1* 9/2008 Chen ................. G02F 1/136213
  349/38
2011/0297941 A1* 12/2011 Zhan ....................... H01L 28/87
  257/59
2013/0256678 A1* 10/2013 Nishikawa ............ H01L 27/124
  257/72
2014/0231799 A1* 8/2014 Matsubayashi ..... H01L 27/0629
  257/43
2016/0011467 A1* 1/2016 Choi ................. G02F 1/134309
  257/72

FOREIGN PATENT DOCUMENTS

| | | |
|---|---|---|
| CN | 102269901 A | 12/2011 |
| CN | 103777418 A | 5/2014 |
| CN | 103715141 B | 2/2015 |
| CN | 104867878 A | 8/2015 |

* cited by examiner

ARRAY SUBSTRATE AND FABRICATION METHOD, DISPLAY PANEL, AND DISPLAY DEVICE

CROSS-REFERENCES TO RELATED APPLICATIONS

This application claims the priority of Chinese Patent Application No. CN201610200728.8, filed on Mar. 31, 2016, the entire contents of which are incorporated herein by reference.

FIELD OF THE DISCLOSURE

The present disclosure generally relates to the touch control technologies and, more particularly, relates to an array substrate, a fabrication method thereof, a display panel incorporating the array substrate, and a display device incorporating the display panel.

BACKGROUND

Today, with advances in technologies, people are demanding more from the display technology. The display resolutions have been increasing gradually. High definition, ultra high definition, full high definition, retina technology, 2K, 4K, 8K, 10K, and other display technology terms are getting into people's daily life.

PPI (pixels per inch), a measurement of pixel density or resolution, represents the number of pixels per inch. The higher the PPI value, the higher resolution the display panel may display images. The market demands higher and higher PPI for the displays, and the pixel sizes are getting smaller and smaller. However, at the same time, the pixel circuits are getting more and more complicated. The complicated pixel circuits and the wiring layout of high PPI display structures become a great challenge to the fabrication process and equipment.

The disclosed array substrate, fabrication method, display panel and display device are directed to solve one or more problems in the art.

BRIEF SUMMARY OF THE DISCLOSURE

Directed to solve one or more problems set forth above and other problems in the art, the present disclosure provides an array substrate, a fabrication method, a display panel and a display device.

One aspect of the present disclosure includes an array substrate. The array substrate includes a substrate, a first functional layer configured on one side of the substrate, a first insulating layer configured on the first functional layer facing away from the substrate, a second functional layer configured on the first insulating layer facing away from the substrate, a second insulating layer configured on the second functional layer facing away from the substrate, a third functional layer configured on the second insulating layer facing away from the substrate, a third insulating layer configured on the third functional layer facing away from the substrate, a fourth functional layer configured on the third insulating layer facing away from the substrate, and a plurality of through-holes configured to electrically connect different functional layers, wherein the depth of any through-holes does not exceed the thickness of two adjacent insulating layers.

Another aspect of the present disclosure includes a method of fabricating the array substrate. The fabrication method includes the following steps. A substrate is provided. The graphic pattern of a first functional layer is deposited on the substrate. A first insulating layer is deposited on the first functional layer. The graphic pattern of a second functional layer is deposited on the first insulating layer. A second insulating layer is deposited on the second functional layer. The first and second insulating layers are etched to form a plurality of first-type through-holes that penetrate the first and second insulating layers. The graphic pattern of a third functional layer is deposited on the second insulating layer. At least a portion of the third functional layer is electrically connected to at least a portion of the first functional layer by the first-type through-holes. A third insulating layer is deposited on the third functional layer. The third insulating layer is etched to form a plurality of second-type through-holes that penetrate the third insulating layer. The graphic pattern of a fourth functional layer is deposited on the third insulating layer. At least a portion of the third functional layer is electrically connected to at least a portion of the fourth functional layer by the second-type through-holes.

Another aspect of the present disclosure includes a display panel. The display panel includes a disclosed array substrate and a light emitting functional layer located on the array substrate.

Another aspect of the present disclosure includes a display device. The display device includes the disclosed display panel.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts. It should be understood that the exemplary embodiments described herein are only intended to illustrate and explain the present invention and not to limit the present invention.

In a display pane, pixel driving circuits may include a plurality of thin film transistors (TFT) arranged in an array and a plurality of signal lines that are located between the TFTs and carry the control signals to control individual TFT. The TFTs may be multi-layer structures including a plurality of active layer, gate electrode layer, source and drain electrode layer. The signal lines may often be disposed on the top layer of the TFT array substrate, and may be coplanar with the source and drain electrodes of the TFTs. As the PPI increases and the pixel circuits get more complicated, the layout effort for the top layer of the TFT array substrate may become more and more difficult.

Further, in a conventional fabrication process of TFT array substrates, conductive structures located in different layers may be electrically connected by through-holes. Under most circumstances, the conductive structures located in one layer may need to electrically connect to the conductive structures located in different layers. As a result, different through-holes may be etched to penetrate different number of layers and may have different depths. When the through-holes with different depths are etched in a same step of the fabrication process, the shallower through-holes may be over-etched to have undesired wider diameters.

The through-holes with undesired wider diameters may cause problems to the wiring layout of high PPI display array substrates. In the meantime, due to positioning deviation constraints of manufacturing equipment, the wider diameter through-holes may need wider area metal layers to completely cover the through-holes to connect properly. The wider area metal layers may be undesired for the wiring layouts of high PPI display array substrates.

In order to control the through-hole diameters that vary with the through-hole depths, the fabrication process may have to be adjusted to compensate the through-hole depth differences. However, such adjustment may be less effective and costly when variations between different fabrication processes or within a same fabrication process and variations between different manufacturing equipment are factored in.

Thus, an improved array substrate design is needed to avoid or contain the problems caused by through-hole depth variations and to ease the wiring layout effort on the top layer of TFT array substrates. Such array substrates may make even higher PPI display products possible.

Figure 1:
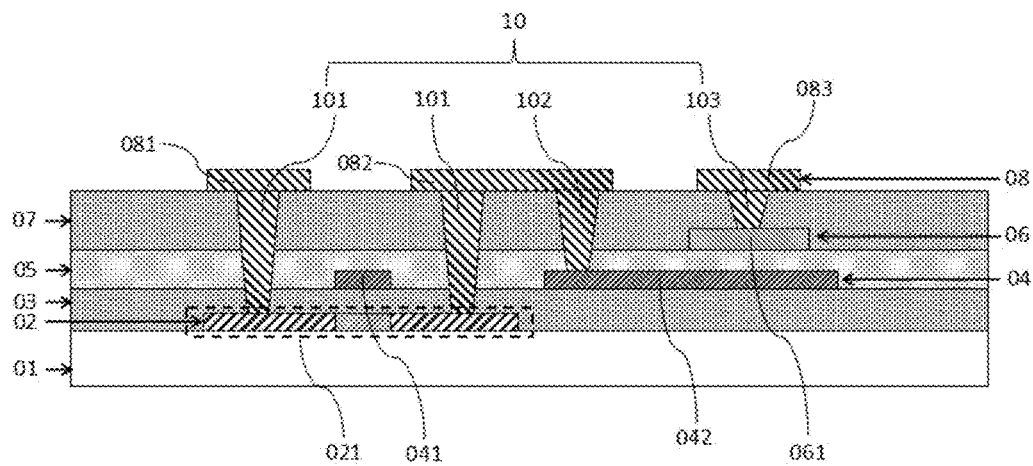
FIG. 1 illustrates a partial cross-sectional view of a conventional LTPS array substrate.

FIG. 1 illustrates a partial cross-sectional view of a conventional LTPS (Low Temperature Poly-Silicon) array substrate. Referring to FIG. 1, the LTPS array substrate may include a substrate 01, a first functional layer 02 configured on one side of the substrate 01, a first insulating layer 03 configured on the side of the first functional layer 02 away from the substrate 01, a second functional layer 04 configured on the side of the first insulating layer 03 away from the substrate 01, a second insulating layer 05 configured on the side of the second functional layer 04 away from the substrate 01, a third functional layer 06 configured on the side of the second insulating layer 05 away from the substrate 01, a third insulating layer 07 configured on the side of the third functional layer 06 away from the substrate 01, a fourth functional layer 08 configured on the side of the third insulating layer 07 away from the substrate 01.

As shown in FIG. 1, the LTPS array substrate may also include at least one No. 0 transistor (not labeled) and at least one No. 0 storage capacitor (not labeled). The No. 0 transistor may have a source electrode 081 and a drain electrode 082, both located in the fourth functional layer 08. The gate electrode 041 of the No. 0 transistor may be located in the second functional layer 04. The active layer 021 may be located in the first functional layer 02. The No. 0 storage capacitor may have a first electrode 042 located in the second functional layer 04, and a second electrode 061 located in the third functional layer 06.

The source electrode 081 and the drain electrode 082 of the No. 0 transistor may be electrically connected to the active layer 021 respectively by the two through-holes 101 that penetrate the first insulating layer 03, the second insulating layer 05, and the third insulating layer 07. The drain electrode 082 of the No. 0 transistor may also be electrically connected to the first electrode 042 of the No. 0 storage capacitor by the through-hole 102 that penetrates the second insulating layer 05 and the third insulating layer 07.

In addition, the second electrode 061 of the No. 0 storage capacitor may be electrically connected to the conductive portion 083 located in the fourth functional layer 08 by the through-hole 103 that penetrates the third insulating layer 07. The conductive portion 083 may be part of a metal wire located in the fourth functional layer 08, or a source electrode or drain electrode of another transistor, or other form of required electrical connection.

As shown in FIG. 1, the through-holes 10 of the LTPS array substrate may have three different depths. These through-holes 10 may be formed by etching in a single step of the fabrication process. That is, in the fabrication process of the LTPS array substrate shown in FIG. 1, the through-holes 101, 102, and 103 with different depths may be formed in a single step. Forming through-holes with different depths in a single step may cause uneven etching. The resulting through-holes may have uneven diameters and may occupy uneven layout space. Such fabrication process may also cause an increased critical dimension (CD) loss or increased diameters in the shallower through-holes.

During the layer forming process, due to positioning deviation constraints of manufacturing equipment, the wider diameter through-holes may need wider area metal layers to completely cover the through-holes to connect properly. The wider area metal layers may be undesired for the wiring layouts of high PPI display array substrates. In addition, as shown in FIG. 1, the scanning lines, data lines, voltage signal lines, etc. of the array substrate may be located in the fourth functional layer 08.

The market demands higher and higher PPI for the displays. The pixel sizes are getting smaller and smaller. However at the same time, the pixel circuits are getting more and more complicated. The conventional fabrication process may be unable to satisfy the requirements for complicated pixel circuits and the wiring layout of high PPI display structures.

The disclosed array substrate, fabrication method for the array substrate, display panel and display device incorporating at least one array substrate are directed to solve one or more problems in the art.

Figure 2:
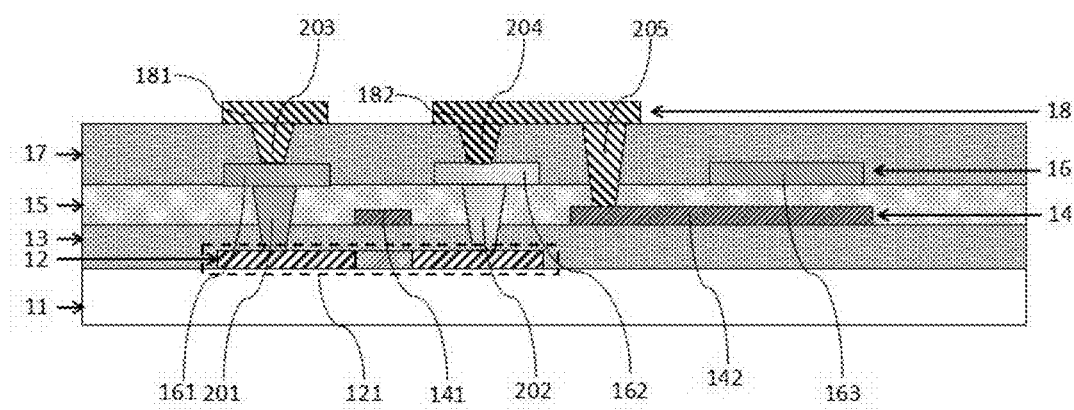
FIG. 2 illustrates a partial cross-sectional view of an exemplary LTPS array substrate according to the disclosed embodiments.

FIG. 2 illustrates a partial cross-sectional view of an exemplary LTPS array substrate according to the present disclosure. Referring to FIG. 2, the LTPS array substrate may include a substrate 11, a first functional layer 12 configured on one side of the substrate 11, a first insulating layer 13 configured on the side of the first functional layer 12 away from the substrate 11, a second function allayer 14 configured on the side of the first insulating layer 13 away from the substrate 11, a second insulating layer 15 configured on the side of the second functional layer 14 away from the substrate 11, a third functional layer 16 configured on the side of the second insulating layer 15 away from the substrate 11, a third insulating layer 17 configured on the side of the third functional layer 16 away from the substrate 11, a fourth functional layer 18 configured on the side of the third insulating layer 17 away from the substrate 11, and a plurality of through-holes configured to provide electrical connections between different functional layers. The depths of any through-holes do not exceed the thickness of any two adjacent insulating layers.

As shown in FIG. 2, the plurality of through-holes may include the through-holes 201, 202, 203, 204, and 205. The through-holes 201 and 202 may penetrate the first insulating layer 13 and the second insulating layer 15. The through-holes 203 and 204 may penetrate the third insulating layer 17. The through-hole 205 may penetrate the second insulating layer 15 and the third insulating layer 17. The depths of any through-holes may not exceed the thickness of any two adjacent insulating layers. That is, no through-holes may penetrate more than two insulating layers.

In the LTPS array substrate according to the present disclosure, the insulating layers and the functional layers may be single layer structures or multiple sub-layer structures. That is, the insulating layers may be formed as one insulating layer in one deposition step or as a multi-layer structure with a plurality of insulating sub-layers in a plurality of deposition steps, where the plurality of the insulating sub-layers may be made of same material or different materials. The functional layers may be formed as one functional layer in one deposition step or as a multi-layer structure with a plurality of functional sub-layers in a plurality of deposition steps, where the plurality of the functional sub-layers may be made of same material or different materials.

In one embodiment, for example, the first insulating layer 13 may be a multi-layer structure made of SiOx/SiNx, where the SiOx sub-layer is located between the substrate 11 and the SiNx sub-layer. The second insulating layer 15 may be made of SiNx. The third insulating layer 17 may be a multi-layer structure made of SiOx/SiNx, where the SiOx sub-layer is located between the second insulating layer 15 and the SiNx sub-layer.

The first functional layer 12 may be made of low temperature poly-silicon. The second functional layer 14 may be made of metal molybdenum. The third functional layer 16 may be made of metal molybdenum. The fourth functional layer 18 may be made of metal Ti/Al/Ti. That is, the fourth functional layer 18 may include three sub-layers that are made of metal Ti, Al, and Ti, respectively. The above is only one example of the present disclosure. Other embodiments of the present disclosure may be implemented as well.

In another embodiment of the LTPS array substrate as shown in FIG. 2, the first functional layer 12 may be made of semiconductor material. The second functional layer 14, the third functional layer 16, and the fourth functional layer 18 may be made of metals. In addition, the materials for the functional layers may be any other semiconductor materials or conductive materials, depending on the specific designs.

In one embodiment, the first insulating layer 13 may have a thickness of approximately 100 nm to 200 nm. The second insulating layer 15 may have a thickness of approximately 50 nm to 150 nm. The third insulating layer 17 may have a thickness of approximately 200 nm to 700 nm. Each insulating layer may have a thickness anywhere within the above thickness ranges. The actual thickness of each insulating layer may be determined by specific designs.

The LTPS array substrate as shown in FIG. 2 may also include a first transistor (not labeled). The first transistor may have a semiconductor layer 121 located in the first functional layer 12, a gate electrode 141 located in the second functional layer 14, a source electrode 181 and a drain electrode 182 located in the fourth functional layer 18. The third functional layer 16 may include a first conductive portion 161 and a second conductive portion 162.

The LTPS array substrate according to the present disclosure may also include a first through-hole 201 and a second through-hole 202 that penetrate the first insulating layer 13 and the second insulating layer 15, and a third through-hole 203 and a fourth through-hole 204 that penetrate the third insulating layer 17. The source electrode 181 of the first transistor may be electrically connected to the first conductive portion 161 by the third through-hole 203. At the same time, the first conductive portion 161 may be electrically connected to the semiconductor layer 121 of the first transistor by the first through-hole 201. The drain electrode 182 of the first transistor may be electrically connected to the second conductive portion 162 by the fourth through-hole 204. At the same time, the second conductive portion 162 may be electrically connected to the semiconductor layer 121 of the first transistor by the second through-hole 202.

Figure 3:
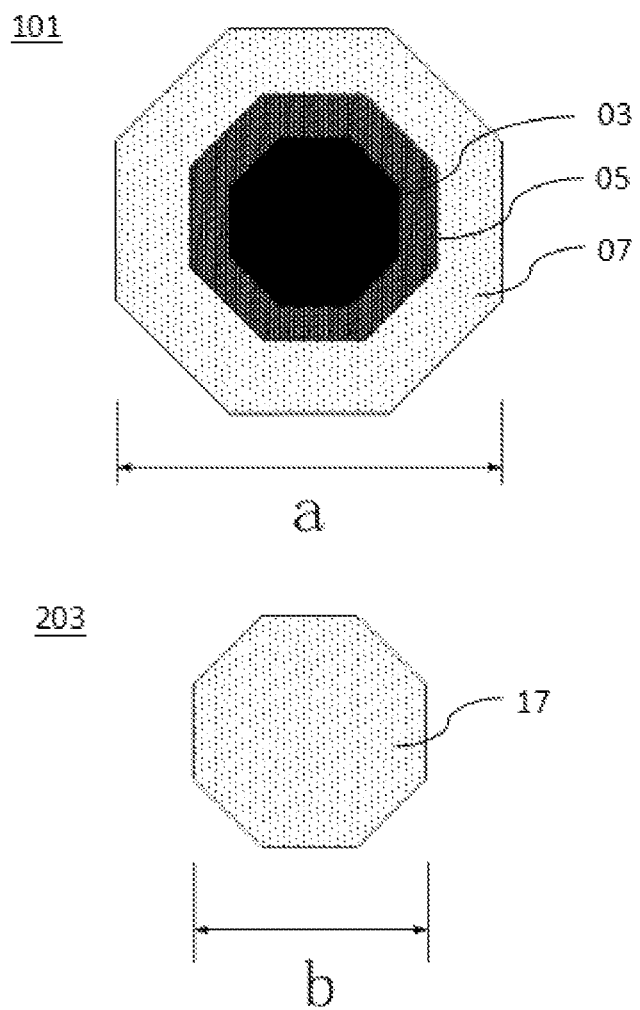
FIG. 3 illustrates a comparison in dimensions between the through-hole 101 in FIG. 1 and the through-hole 203 in FIG. 2.

Compared to the conventional LTPS array substrate, the LTPS array substrate according to the present disclosure may form certain electrical connections between different functional layers in multiple etching steps. FIG. 3 illustrates a comparison in dimensions between the through-hole 101 in FIG. 1 and the through-hole 203 in FIG. 2. Referring to FIG. 3, the dimension in the fourth functional layer 18 of the through-hole 101 that penetrates three insulating layer is compared to the dimension in the fourth functional layer 18 of the through-hole 203 that is formed in multiple etching steps according to the present disclosure.

As shown in FIG. 3, 'a' is the diameter of the through-hole 101 in the forth functional layer 18 when the through-hole 101 penetrates three insulating layers in a single etching step, and 'b' is the diameter of the through hole 203 in the fourth functional layer 18 when the through-hole 203 is formed in multiple etching steps, and a>b may be realized. Thus, it is more likely to control the diameter of the through-hole in the multiple etching steps to avoid or contain the problem of layout space loss caused by through-hole depth variations. The multiple etching steps may reduce the layout space loss due to the through-hole depth variations, reduce the metal layer areas, avoid short-circuits, and improve the production yield.

Due to the reduced layout space loss of the through-holes, the array substrate according to the present disclosure may have smaller areas occupied by the pixel display region and/or peripheral region. This is desired for high PPI display panel layout designs and narrow bezel designs.

In one embodiment, as shown in FIG. 2, the LTPS array substrate according to the present disclosure may also include a first capacitor (not labeled), a fifth through-hole 205 that penetrates the second insulating layer 15 and the third insulating layer 17. The first capacitor may include a first electrode 142 located in the second functional layer 14, and a second electrode 163 located in the third functional layer 16. The first electrode 142 may be electrically connected to the drain electrode 182 of the first transistor by the fifth through-hole 205. In certain other embodiments, the first electrode 142 may be electrically connected to the source electrode 181 of the first transistor by a through-hole, depending on specific designs.

In one embodiment, the second electrode 163 of the first capacitor may not be electrically connected to any other functional layers by through-holes. Instead, the second electrode 163 of the first capacitor may be electrically connected to other structures in the third functional layer 16 through the same layer wiring. Such structures may include transistors, capacitors, signal lines, and etc. Thus, the layout wiring may be separated into multiple functional layers to ease the layout effort in the fourth functional layer 18.

Figure 4:
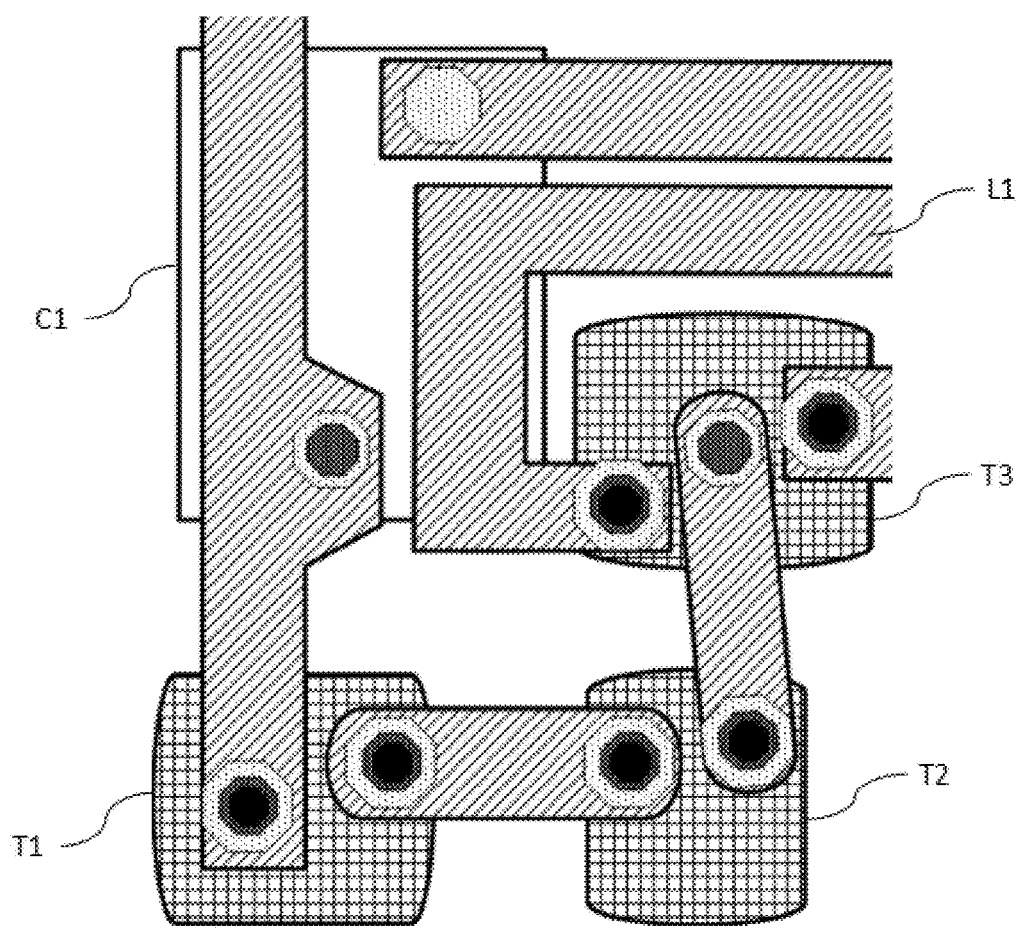
FIG. 4 illustrates a partial top view of wiring layout of a conventional LTPS array substrate.

FIG. 4 illustrates a partial top view of wiring layout of a conventional LTPS array substrate. Referring to FIG. 4, the LTPS array substrate may include a capacitor C1, and transistors T1, T2, and T3. As shown in FIG. 4, the wiring of all the electrodes of the components on the array substrate and the signal lines such as data lines may be configured on the top fourth functional layer. This makes the layout design in the fourth functional layer more difficult. This is undesired for high PPI display panel designs and narrow bezel designs.

Figure 5:
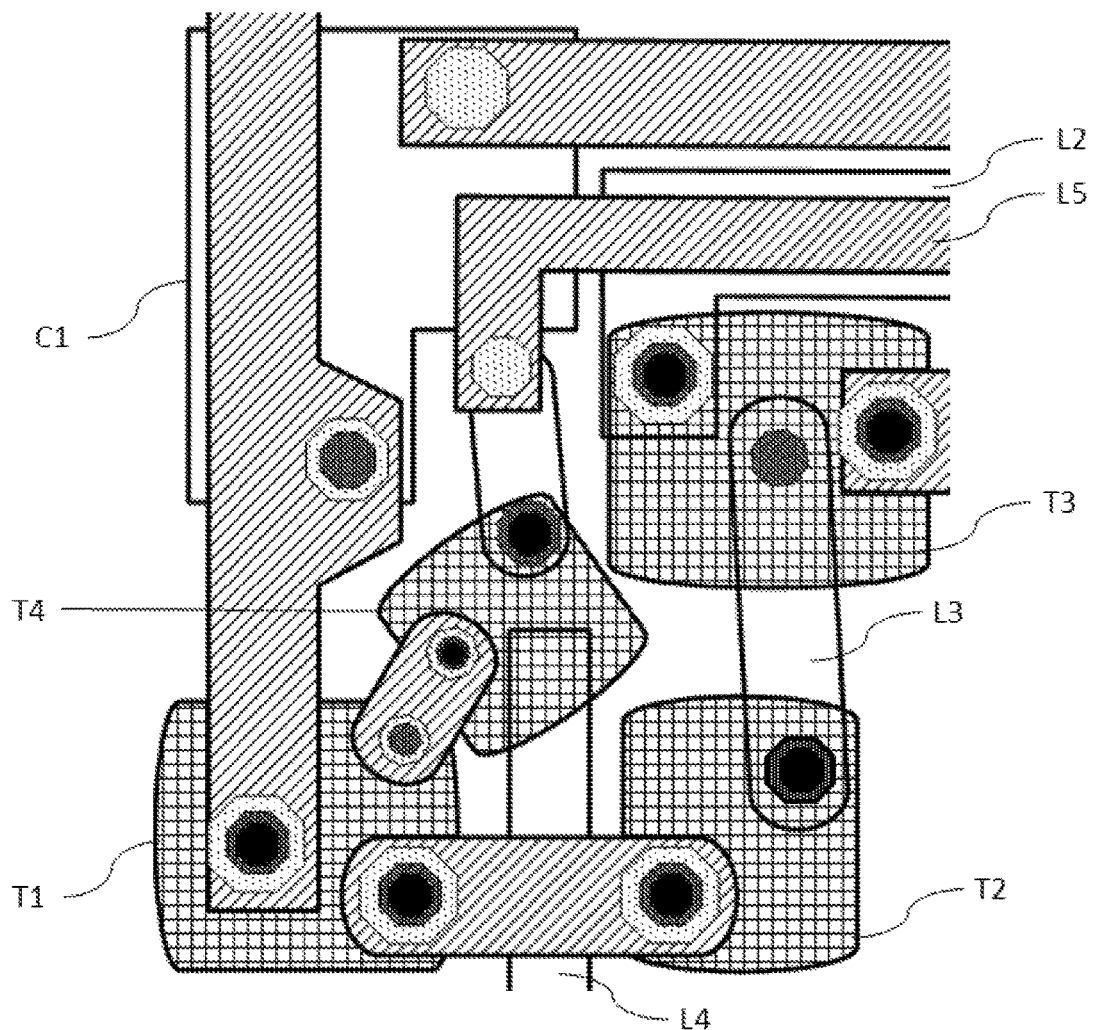
FIG. 5 illustrates a partial top view of wiring layout of an exemplary LTPS array substrate according to the disclosed embodiments.

FIG. 5 illustrates a partial top view of wiring layout of an exemplary LTPS array substrate according to the present disclosure. Referring to FIG. 5, the signal lines L1 and L3 located in the fourth functional layer in FIG. 4 may be configured in the third functional layer. By taking advantage of the unused space in the third functional layer for the wiring layout, the wiring layout effort in the fourth functional layer may be eased. With the ease of the wiring layout effort, a same area on the array substrate may accommodate more driving structures.

As shown in FIG. 5, a transistor T4 may be added to the same layout area. The drain electrode of the transistor T4 may be connected to other part of array substrate by a signal line L5 located in the fourth functional layer. The gate electrode of the transistor T4 may be connected to other circuit component by a signal line L4 located in the third functional layer. The orthogonal projection of the signal line L5 on the substrate may intersect with the orthogonal projection of the signal line L2 on the substrate. The orthogonal projection of the signal line L4 on the substrate may intersect with the orthogonal projection of the signal line on the substrate, which is configured in the fourth functional layer to connect the drain electrode of the transistor T1 and the source electrode of the transistor T2.

By separating the layout wiring in different metal layers and electrically connecting the layout wiring in different metal layers together by through-holes, the utilization of the layout area may be maximized. Such wiring layout method may also have desired flexibility and simplicity. At the same time, the areas occupied by the pixel display region and/or peripheral region may still be very compact. The wiring layout method may also be desired for high PPI display panel designs and narrow bezel designs.

Figure 6:
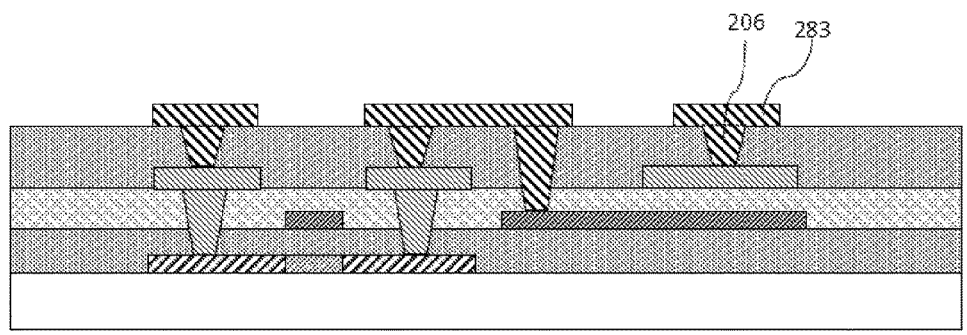
FIG. 6 illustrates a partial cross-sectional view of another exemplary LTPS array substrate according to the disclosed embodiments.

In certain other embodiments, there may be other variations of providing electrical connection to the electrodes of the first capacitor. FIG. 6 illustrates a partial cross-sectional view of another exemplary LTPS array substrate according to the present disclosure. Referring to FIG. 6, the LTPS array substrate may also include a sixth through-hole 206 that penetrates the third insulating layer, and a third conductive portion 283 located in the fourth functional layer. The second electrode of the first capacitor may be electrically connected to the third conductive portion 283 by the sixth through-hole.

Figure 7:
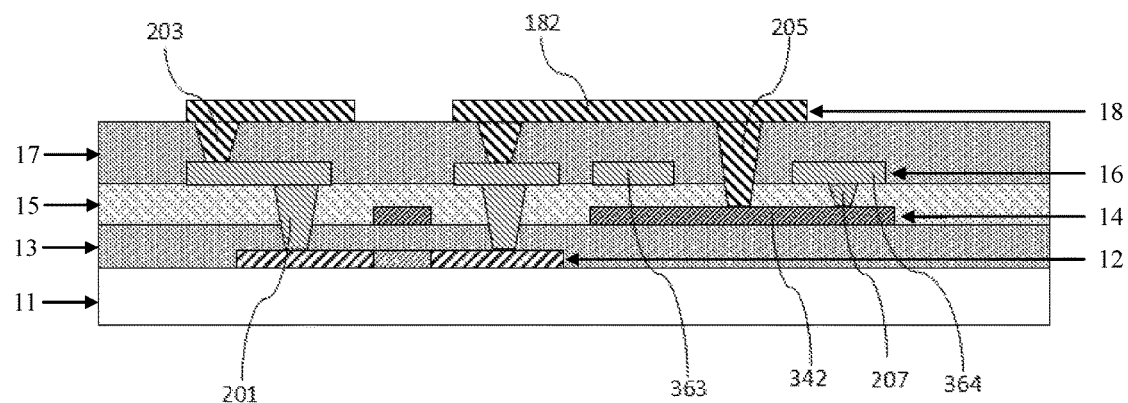
FIG. 7 illustrates a partial cross-sectional view of another exemplary LTPS array substrate according to the disclosed embodiments.

In certain other embodiments, there may be other variations of providing electrical connection to the electrodes of the first capacitor. FIG. 7 illustrates a partial cross-sectional view of another exemplary LTPS array substrate according to the present disclosure. Referring to FIG. 7, the LTPS array substrate may also include a seventh through-hole 207 that penetrates the second insulating layer, and a fourth conductive portion 364 located in the third functional layer.

The drain electrode 182 of the first transistor may be electrically connected to the first electrode 342 of the first capacitor by the fifth through-hole 205. The first electrode 342 of the first capacitor may be electrically connected to the fourth conductive portion 364 by the seventh through-hole 207, where the second electrode 363 of the first capacitor and the fourth conductive portion 364 may be located on both ends of the fifth through-hole 205.

The flexible capacitor electrode configurations and the flexible capacitor electrode connections may be incorporated into the wiring layout design for optimization. In specific product designs, the capacitor electrode configurations and the capacitor electrode connections may not be limited to the disclosed embodiments. Other variations and modifications are still within the scope of the present invention.

In addition, the LTPS array substrate shown in FIG. 7 may have other variations for the configurations of the first through-hole 201 and the third through-hole 203 connecting the electrodes of the first transistor. In one embodiment, the orthogonal projection centers of the first through-hole 201 and the third through-hole 203 on the substrate may not coincide. In other words, the centerlines of the first through-hole 201 and the third through-hole 203 may not coincide.

Accordingly, in the array substrate according to the present disclosure, the orthogonal projection centers of any two through-holes on the substrate may not coincide. The flexibility to configure the through-holes in different positions to connect the wiring in different metal layers may maximize the utilization of the layout area. Such wiring layout method may also have flexibility and simplicity, desired for high PPI display panel designs and narrow bezel designs.

Figure 8:
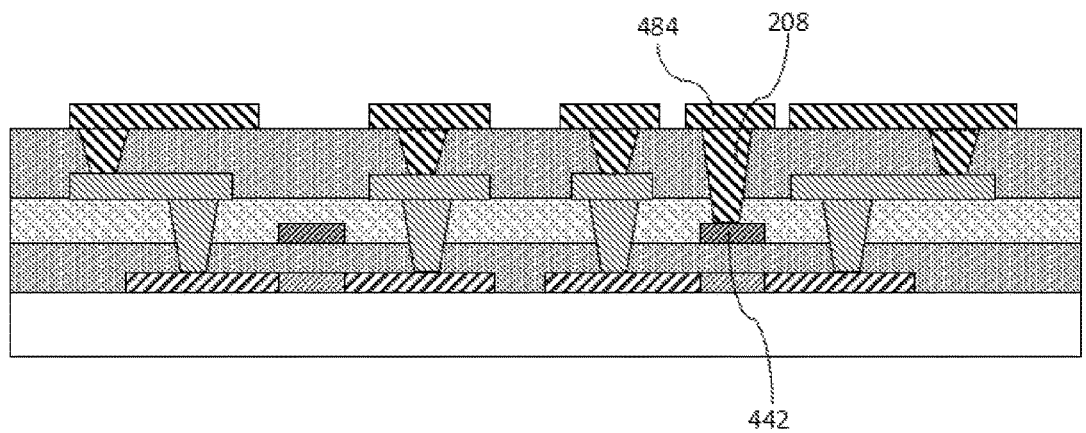
FIG. 8 illustrates a partial cross-sectional view of another exemplary LTPS array substrate according to the disclosed embodiments.

In certain other embodiments, the array substrate may also include a second transistor, in addition to the first transistor. FIG. 8 illustrates a partial cross-sectional view of another exemplary LTPS array substrate according to the present disclosure. Referring to FIG. 8, the LTPS array substrate may also include a second transistor, and an eighth through-hole 208 that penetrates the second insulating layer and the third insulating layer.

A semiconductor layer of the second transistor may be located in the first functional layer. A gate electrode 442 of the second transistor may be located in the second functional layer. A source electrode and a drain electrode of the second transistor may be located in the fourth functional layer. The source electrode or the drain electrode of the first transistor may be electrically connected to the gate electrode 442 of the second transistor by the eighth through-hole 208.

Referring to FIG. 8, the gate electrode 442 of the second transistor may electrically connected to a fifth conductive portion 484 located in the fourth functional layer by the eighth through-hole 208. The fifth conductive portion 484 may be a part of the source or drain electrode of the first transistor, or a part of the signal line connecting to the source or drain electrode of the first transistor. Thus, the source or drain electrode of the first transistor may be electrically connected to the gate electrode 442 of the second transistor by the eighth through-hole 208.

Figure 9:
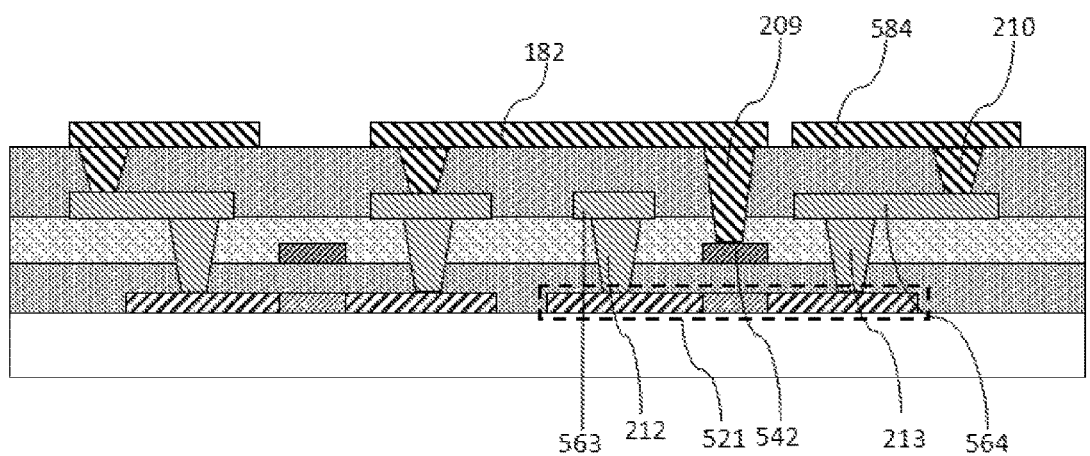
FIG. 9 illustrates a partial cross-sectional view of another exemplary LTPS array substrate according to the disclosed embodiments.

In addition to the first transistors, the LTPS array substrate according to the present disclosure may also include a third transistor and a ninth through-hole 209 that penetrates the second insulating layer and the third insulating layer. FIG. 9 illustrates a partial cross-sectional view of another exemplary LTPS array substrate according to the present disclosure. Referring to FIG. 9, a semiconductor layer 521 of the third transistor may be located in the first functional layer. The gate electrode 542 of the third transistor may be located in the second functional layer. The source electrode 563 and the drain electrode 564 of the third transistor may be located in the third functional layer.

The source electrode 563 and the drain electrode 564 of the third transistor may be electrically connected to the semiconductor layer 521 by a twelfth through-hole 212 and a thirteenth through-hole 213, respectively. The drain electrode 182 of the first transistor may be electrically connected to the gate electrode 542 of the third transistor by the ninth through-hole 209. At the same time, the source electrode 563 and the drain electrode 564 of the third transistor may be electrically connected to other circuit components or signal lines as shown in FIG. 9 and FIG. 10.

Referring to FIG. 9, the LTPS array substrate may also include a tenth through-hole 210 that penetrates the third insulating layer, and a fifth conductive portion 584 located in the fourth functional layer. The source electrode or drain electrode of the third transistor may be electrically connected to the fifth conductive portion 584 by the tenth through-hole 210.

Figure 10:
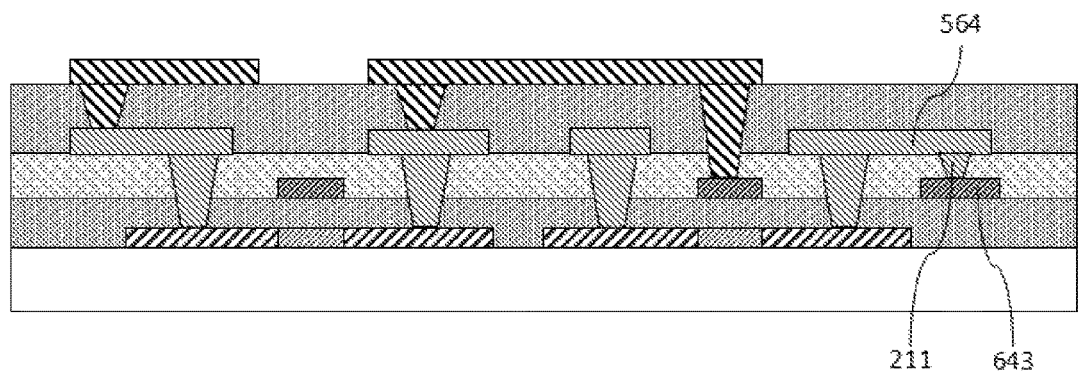
FIG. 10 illustrates a partial cross-sectional view of another exemplary LTPS array substrate according to the disclosed embodiments.

FIG. 10 illustrates a partial cross-sectional view of another exemplary LTPS array substrate according to the present disclosure. Referring to FIG. 10, the LTPS array substrate may also include an eleventh through-hole 211 that penetrates the second insulating layer, and a sixth conductive portion 643 located in the second functional portion. The source electrode or drain electrode of the third transistor may be electrically connected to the sixth conductive portion 643 by the eleventh through-hole 211.

Figure 11:
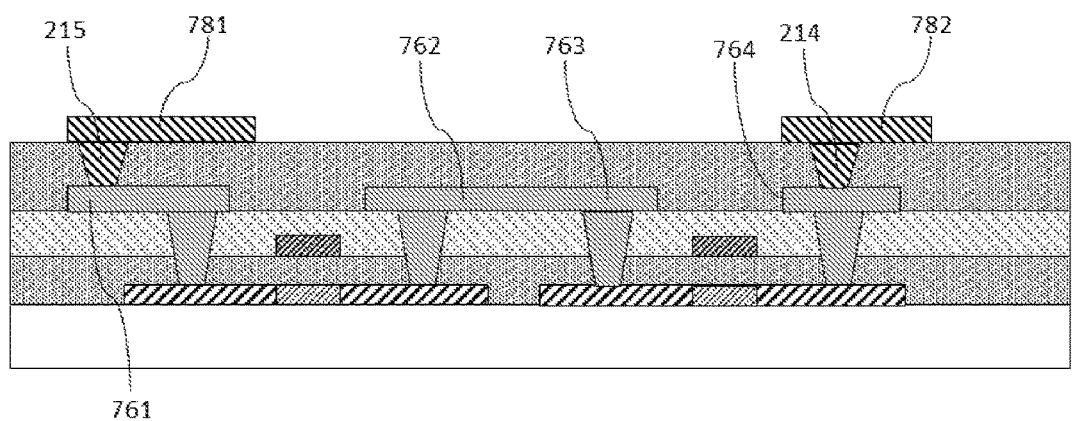
FIG. 11 illustrates a partial cross-sectional view of another exemplary LTPS array substrate according to the disclosed embodiments.
Figure 12:
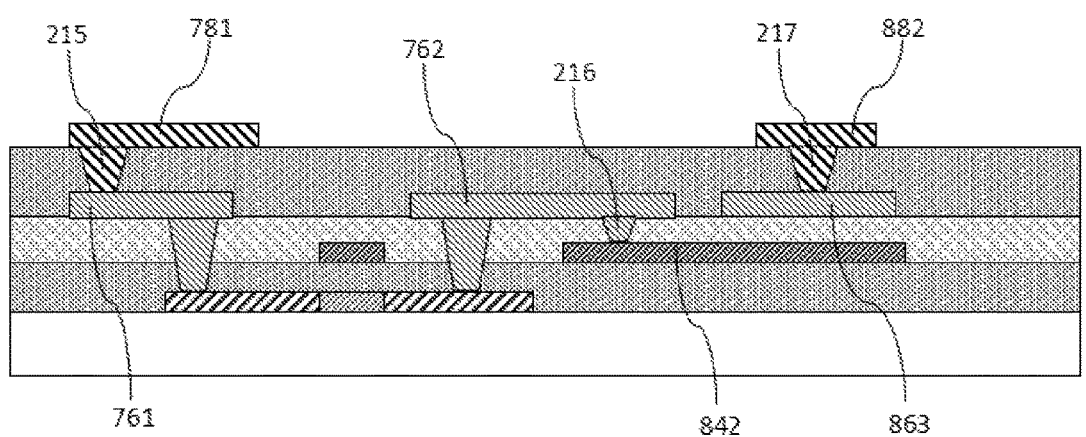
FIG. 12 illustrates a partial cross-sectional view of another exemplary LTPS array substrate according to the disclosed embodiments.

In certain other embodiments, the array substrate may have configuration as shown in FIG. 11 and FIG. 12. FIG. 11 illustrates a partial cross-sectional view of another exemplary LTPS array substrate according to the present disclosure. Referring to FIG. 11, the LTPS array substrate may include a fourth transistor and a fifth transistor. The fourth transistor and the fifth transistor may have structures similar to the third transistor. The semiconductor layer may be located in the first functional layer. The gate electrode may be located in the second functional layer. The source electrode and the drain electrode may be located in the third functional layer.

The difference is that the source electrode 761 of the fourth transistor may be electrically connected to a sixth conductive portion 781 located in the fourth functional layer by a fifteenth through-hole 215. The drain electrode 762 of the fourth transistor may be electrically connected to the source electrode 763 of the fifth transistor directly in the third functional layer. The drain electrode 764 of the fifth transistor may be electrically connected to a seventh conductive portion 782 located in the fourth functional layer by a fourteenth through-hole 214. The orthogonal projection centers of the fifteenth through-hole 215 and the through-hole under the source electrode 761 of the fourth transistor on the substrate may not coincide.

FIG. 12 illustrates a partial cross-sectional view of another exemplary LTPS array substrate according to the present disclosure. Referring to FIG. 12, the LTPS array substrate may also include a fourth transistor, a second storage capacitor, a sixteenth through-hole 216, a seventeenth through-hole 217, and an eighth conductive portion 882. The drain electrode 762 of the fourth transistor may be electrically connected to the first electrode 842 of the second storage capacitor by the sixteenth through-hole 216. The second electrode 863 of the second storage capacitor may be electrically connected to the eighth conductive portion 882 located in the fourth functional layer by the seventeenth through-hole 217.

Figure 16:
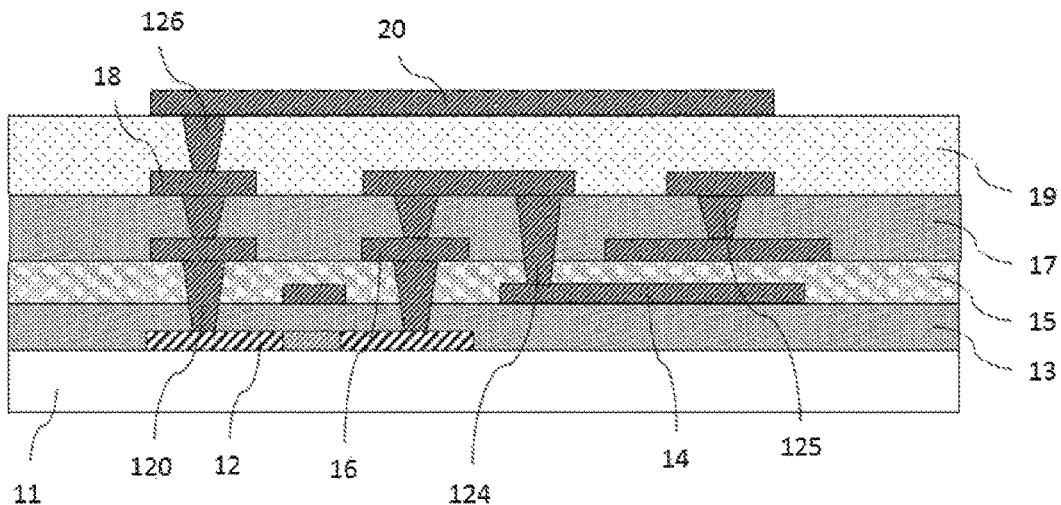
FIG. 16 illustrates a partial cross-sectional view of another exemplary LTPS array substrate according to the disclosed embodiments.

In certain other embodiments, more functional layers and insulating layers may be formed on the substrate. FIG. 16 illustrates a partial cross-sectional view of another exemplary LTPS array substrate according to the present disclosure. Referring to FIG. 16, the array substrate may include a substrate 11, a semiconductor layer 12, a first insulating layer 13, a first metal layer 14, a second insulating layer 15, a second metal layer 16, a third insulating layer 17, a third metal layer 18, a fourth insulating layer 19, a fourth metal layer 20, a twentieth though-hole 120, a twenty first through-hole (not labeled), a twenty second through-hole (not labeled), a twenty third through-hole (not labeled), a twenty fourth through-hole 124, a twenty fifth through-hole 125, and a twenty sixth through-hole 126.

The semiconductor layer 12 may be formed on the substrate 11. The first insulating layer 13 may be formed on the semiconductor layer 12. The first metal layer 14 may be formed on the first insulating layer 13. The second insulating layer 15 may be formed on the first metal layer 14. The second metal layer 16 may be formed on the second insulating layer 15. The third insulating layer 17 may be formed on the second metal layer 16. The third metal layer 18 may be formed on the third insulating layer 17. The fourth insulating layer 19 may be formed on the third metal layer 18. The fourth metal layer 20 may be formed on the fourth insulating layer 19. The fourth metal layer 20 may include light emitting electrodes.

The twentieth through-hole 120 and the twenty first through-hole may be formed before the second metal layer 16 is formed, and may be electrically connected to the semiconductor layer 12. The twenty second through-hole, the twenty third through-hole, the twenty fourth through-hole 124, and the twenty fifth through-hole 125 may be formed before the third metal layer 18 is formed, and may be electrically connected to the first metal layer 14 or the second metal layer 16. The twenty sixth through-hole 126 may be formed before the fourth metal layer 20 is formed, and may be electrically connected to the third metal layer 18.

The first metal layer 14 and the second metal layer 16 may be made of Mo material. The third metal layer 18 may be made of Ti/Al/Ti material. The fourth metal layer 20 may be made of ITO/Ag/ITO material.

The first insulating layer 13 may be made of SiOx/SiNx material, and may have a thickness of approximately 100 nm to 200 nm. The second insulating layer 15 may be made of SiNx material, and may have a thickness of approximately 50 nm to 150 nm. The third insulating layer 17 may be made of SNx/SiOx material, and may have a thickness of approximately 200 nm to 700 nm. The fourth insulating layer 19 may be made of organic material, and may have a thickness of approximately 1000 nm to 3000 nm.

The twenty second through-hole and the twenty third through-hole may be electrically connected to the semiconductor layer 12 through the concatenated twentieth through-hole 120 and twenty first through-hole. Thus, the diameter variations of different depth through-holes may be reduced.

Figure 17:
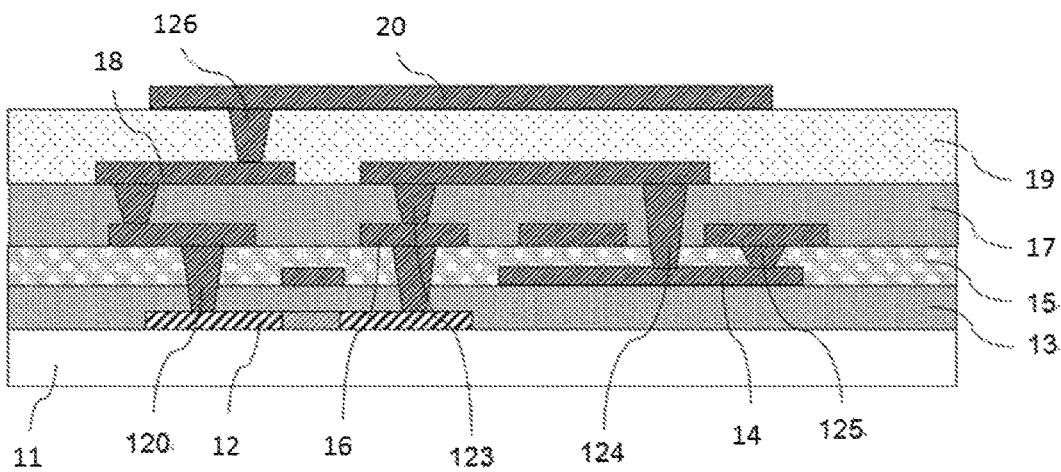
FIG. 17 illustrates a partial cross-sectional view of another exemplary LTPS array substrate according to the disclosed embodiments.

FIG. 17 illustrates a partial cross-sectional view of another exemplary LTPS array substrate according to the present disclosure. Referring to FIG. 17, the array substrate may include a substrate 11, a semiconductor layer 12, a first insulating layer 13, a first metal layer 14, a second insulating layer 15, a second metal layer 16, a third insulating layer 17, a third metal layer 18, a fourth insulating layer 19, a fourth metal layer 20, a twentieth though-hole 120, a twenty first through-hole (not labeled), a twenty second through-hole (not labeled), a twenty third through-hole (not labeled), a twenty fourth through-hole 124, a twenty fifth through-hole 125, and a twenty sixth through-hole 126.

The semiconductor layer 12 may be formed on the substrate 11. The first insulating layer 13 may be formed on the semiconductor layer 12. The first metal layer 14 may be formed on the first insulating layer 13. The second insulating layer 15 may be formed on the first metal layer 14. The second metal layer 16 may be formed on the second insulating layer 15. The third insulating layer 17 may be formed on the second metal layer 16. The third metal layer 18 may be formed on the third insulating layer 17. The fourth insulating layer 19 may be formed on the third metal layer 18. The fourth metal layer 20 may be formed on the fourth insulating layer 19. The fourth metal layer 20 may include light emitting electrodes.

The twentieth through-hole 120 and the twenty first through-hole may be formed before the second metal layer 16 is formed, and may be electrically connected to the semiconductor layer 12. The twenty fifth through-hole 125 may be formed before the second metal layer 16 is formed, and may be electrically connected to the first metal layer 14. The twenty second through-hole, the twenty third through-hole, and the twenty fourth through-hole 124 may be formed before the third metal layer 18 is formed, and may be electrically connected to the first metal layer 14 or the second metal layer 16. The twenty sixth through-hole 126 may be formed before the fourth metal layer 20 is formed, and may be electrically connected to the third metal layer 18.

The first metal layer 14 may be made of Mo material. The second metal layer 16 and the third metal layer 18 may be made of Ti/Al/Ti material. The fourth metal layer 20 may be made of ITO/Ag/ITO material.

The first insulating layer 13 may be made of SiOx/SiNx material, and may have a thickness of approximately 100 nm to 200 nm. The second insulating layer 15 may be made of SiNx material, and may have a thickness of approximately 50 nm to 150 nm. The third insulating layer 17 may be made of SNx/SiOx material, and may have a thickness of approximately 200 nm to 700 nm. The fourth insulating layer 19 may be made of organic material, and may have a thickness of approximately 1000 nm to 3000 nm.

The twenty second through-hole and the twenty third through-hole may be electrically connected to the semiconductor layer 12 through the concatenated twentieth through-hole 120 and twenty first through-hole. Thus, the diameter variations of different depth through-holes may be reduced.

In the array substrate according to the present disclosure, by separating the layout wiring in different metal layers and electrically connecting the layout wiring in different metal layers together by through-holes, the utilization of the layout area may be maximized. Such wiring layout method may also have desired flexibility and simplicity. At the same time, the areas occupied by the pixel display region and/or peripheral region may still be very compact. The wiring layout method may also be desired for high PPI display panel designs and narrow bezel designs.

In addition, people having ordinary skills in the art should appreciate that the array substrate according to the present disclosure may be LTPS array substrates or any other types of array substrates having substrate structures consistent with the disclosed embodiments, such as, the array substrates including amorphous silicon thin film transistors, and array substrates including oxide thin film transistors. Although the LTPS thin film transistors are illustrated in the disclosed embodiments, the scope of the present invention should not be limited to the LTPS array substrates.

Figure 13:
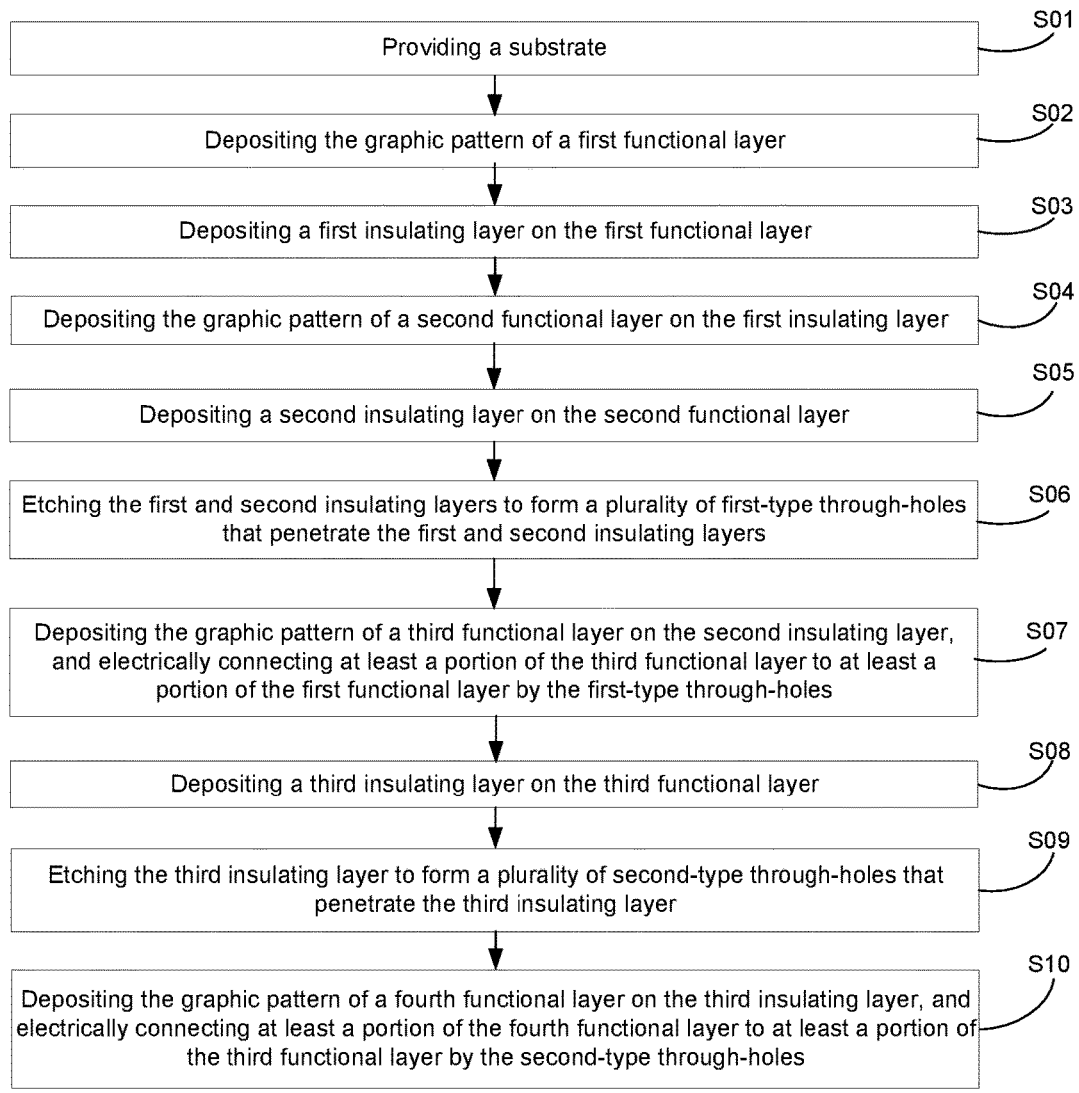
FIG. 13 illustrates a flow chart of a fabrication process for fabricating the LTPS array substrate in FIG. 7.

FIG. 13 illustrates a flow chart of a fabrication process for fabricating the LTPS array substrate in FIG. 7. Referring to FIG. 13, the fabrication process according to the present disclosure may include the following steps.

Step S01: providing a substrate. Specifically, as shown in FIG. 7, a substrate 11 may be provided.

Step S02: depositing the graphic pattern of a first functional layer on the substrate. Specifically, as shown in FIG. 7, a first functional layer 12 may be formed on the substrate 11. The first functional layer 12 may include a semiconductor layer (not labeled) of a first transistor.

Step S03: depositing a first insulating layer on the first functional layer. Specifically, as shown in FIG. 7, a first insulating layer 13 may be formed on the first functional layer 12.

Step S04: depositing the graphic pattern of a second functional layer on the first insulating layer. Specifically, as shown in FIG. 7, a second functional layer 14 may be formed on the first insulating layer 13. The second functional layer 14 may include a gate electrode (not labeled) of the first transistor and a first electrode 342 of a first capacitor.

Step S05: depositing a second insulating layer on the second functional layer. Specifically, as shown in FIG. 7, a second insulating layer 15 may be formed on the second functional layer 14.

Step S06: etching the first and second insulating layers to form a plurality of first-type through-holes that penetrate the first and second insulating layers. Specifically, as shown in FIG. 7, a first through-hole 201, a second through-hole (not labeled), and a seventh through-hole 207 may be formed to connect to the semiconductor layer of the first transistor in the first functional layer 12 and the first electrode 342 of the first capacitor in the second functional layer 14. The first through-hole 201 and the second through-hole may also be called first-type through-holes. And the seventh through-hole 207 may also be called fourth-type through-hole.

Step S07: depositing the graphic pattern of a third functional layer on the second insulating layer, and electrically connect at least a portion of the third functional layer to at least a portion of the first functional layer by the first-type through-holes. Specifically, as shown in FIG. 7, a third functional layer 16 may be formed on the second insulating layer 15. The third functional layer 16 may include a first conductive portion (not labeled), a second conductive portion (not labeled), a second electrode 363 of the first capacitor, and a fourth conductive portion 364.

The first conductive portion may be electrically connected to the semiconductor layer of the first transistor located in the first functional layer 12 by the first through-hole 201 that penetrates the first insulating layer 13 and the second insulating layer 15. The second conductive portion may be electrically connected to the semiconductor layer of the first transistor located in the first functional layer 12 by the second through-hole that penetrates the first insulating layer 13 and the second insulating layer 15. The fourth conductive portion 364 may be electrically connected to the first electrode 342 of the first capacitor located in the second functional layer 14 by the seventh through-hole 207 that penetrates the second insulating layer 15.

Step S08: depositing a third insulating layer on the third functional layer. Specifically, as shown in FIG. 7, a third insulating layer 17 may be formed on the third functional layer 16.

Step S09: etching the second and third insulating layers to form a plurality of second-type through-holes that penetrate the second and third insulating layers. Specifically, as shown in FIG. 7, a third through-hole 203, a fourth through-hole (not labeled), and a fifth through-hole 205 may be formed to connect to the first and second conductive portions in the third functional layer 16 and the first electrode 342 of the first capacitor in the second functional layer 14. The third through-hole 203 and the fourth through-hole (not labeled) may also be called second-type through-holes. And the fifth through-hole 205 may also be called third-type through-hole.

Step S10: depositing the graphic pattern of a fourth functional layer on the third insulating layer, and electrically connect at least a portion of the fourth functional layer to at least a portion of the third functional layer by the second-type through-holes. Specifically, as shown in FIG. 7, a fourth functional layer 18 may be formed on the third insulating layer 17. The fourth functional layer 18 may include a source electrode (not labeled) and a drain electrode 182 of the first transistor.

The source electrode of the first transistor may be electrically connected to the first conductive portion located in the third functional layer 16 by the third through-hole 203 that penetrates the third insulating layer 17. The drain electrode of the first transistor may be electrically connected to the second conductive portion located in the third functional layer 16 by the fourth through-hole that penetrates the third insulating layer 17, and the first electrode 342 of the first capacitor located in the second functional layer 14 by the fifth through-hole 205 that penetrates the second insulating layer 15 and the third insulating layer 17.

The deposited second insulating layer may be etched to form a plurality of first-type of through-holes that penetrate the first insulating layer and the second insulating layer, and at the same time, a plurality of fourth-type through-holes that penetrate the second insulating layer. The first-type through-holes may include the first through-hole 201 and the second through-hole 202 that electrically connect the first conductive portion and the second conductive portion. The fourth-type through-holes may include the seventh through-hole 207 that electrically connects the fourth conductive portion 364 and the first electrode 342 of the first capacitor.

The deposited third insulating layer may be etched to form a plurality of second-type through-holes that penetrate the third insulating layer, and at the same time, a plurality of third-type through-holes that penetrate the second insulating layer and the third insulating layer. The second-type through-holes may include the third through-hole 203 and the fourth through-hole 204. The third-type through-holes may include the fifth through-hole 205 that electrically connects the drain electrode 182 of the first transistor and the first electrode 342 of the first capacitor.

The first-type, the second-type, the third-type, and the fourth-type through-holes are grouped together based on the penetrated layers and the etching sequence, and have nothing to do with the labels of the through-holes. The through-holes with different labels and different functions may still be grouped together into a same type when such through-holes penetrate the same insulating layers.

In certain other embodiments, more functional layers and insulating layers may be formed on the substrate. Accordingly, a method of fabricating the array substrate may include the following steps.

A substrate is provided. A semiconductor layer may be formed on the substrate. A first insulating layer may be formed on the semiconductor layer. A first metal layer may be formed on the first insulating layer. A second insulating layer may be formed on the first metal layer. A second metal layer may be formed on the second insulating layer. A third insulating layer may be formed on the second metal layer. A third metal layer may be formed on the third insulating layer. A fourth insulating layer may be formed on the third metal layer. A fourth metal layer may be formed on the fourth insulating layer. The fourth metal layer may include light emitting electrodes.

The first-type through-holes may be formed before the second metal layer is formed, and may be electrically connected to the semiconductor layer or the first metal layer. The second-type through-holes may be formed before the third metal layer is formed, and may be electrically connected to the first metal layer or the second metal layer. The third-type through-holes may be formed before the fourth metal layer is formed, and may be electrically connected to the third metal layer.

The first metal layer, the second metal layer, the third metal layer, and the fourth metal layer may be made of same or different materials, and may be single layer structures or multiple sub-layer structures.

The first insulating layer, the second insulating layer, the third insulating layer, and the fourth insulating layer may be made of same or different materials, and may be single structures or multiple sub-layer structures.

Figure 14:
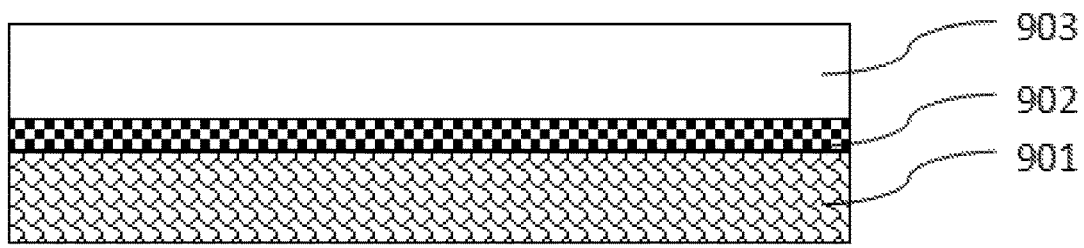
FIG. 14 illustrates a schematic view of an exemplary liquid crystal display panel according to the disclosed embodiments.

FIG. 14 illustrates a schematic view of an exemplary liquid crystal display panel according to the present disclosure. Referring to FIG. 14, the liquid crystal display panel may include an array substrate 901 according to the disclosed embodiments, a display function layer 902, and a color filter substrate 903. In one embodiment, the display panel may be a liquid crystal display panel. In certain other embodiments, the display panel may be an active matrix organic light emitting diode (AMOLED) display panel, a passive matrix organic light emitting diode (PMOLED) display panel, an electronic paper, or other types of display panels.

Figure 15:
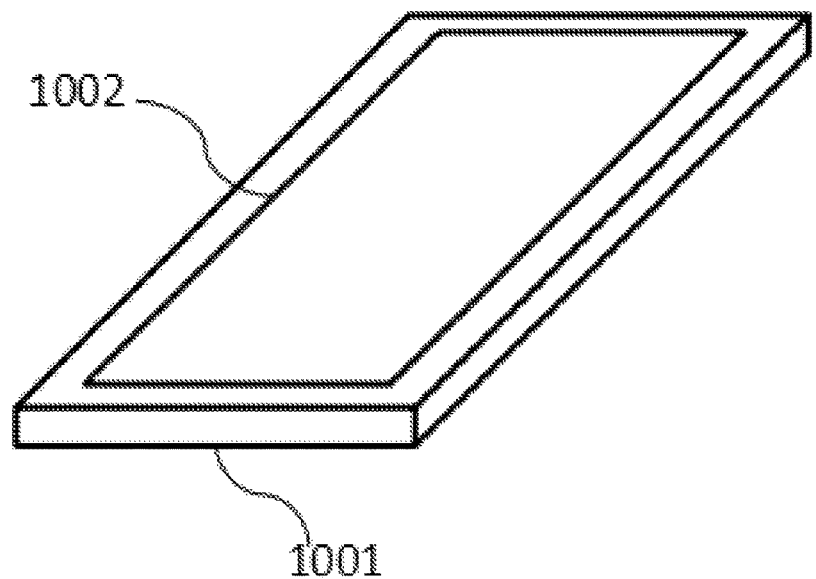
FIG. 15 illustrates a schematic view of an exemplary OLED display device according to the disclosed embodiments.

FIG. 15 illustrates a schematic view of an exemplary OLED display device according to the present disclosure. Referring to FIG. 15, the OLED display device 1001 may include a display panel 1002 that incorporates an array substrate according to the present disclosure. The display device 1001 may be any display device that incorporates the array substrate and the display panel according to the present disclosure. The display device 1001 may include, but not limited to, a television set, a display monitor, a laptop computer, a tablet computer, an auto display, an instrument display, a digital camera, a watch, a wrist band, a pair of smart glasses, or any other display devices.

The present invention provides an array substrate, a method of fabricating the array substrate, a display panel and a display device. Etching the through-holes in multiple steps makes it easier to control the through-hole diameters, avoid or contain the problem of uneven layout space losses in different layers due to different depths of the through-holes, minimize the layout space loss due to the through-holes, reduce the required metal layer surface area, and avoid short-circuits.

By separating the layout wiring in different metal layers and electrically connecting the layout wiring in different metal layers together by through-holes, the utilization of the layout area may be maximized. Such wiring layout method may also have desired flexibility and simplicity. At the same time, the areas occupied by the pixel display region and/or peripheral region may still be very compact. The wiring layout method may also be desired for high PPI display panel designs and narrow bezel designs.

The array substrate according to the present disclosure may form the through-holes in multiple etching steps. Thus, it is more likely to control the diameter of the through-hole in the multiple etching steps to avoid or contain the problem of layout space loss caused by through-hole depth variations. The multiple etching steps may reduce the layout space loss due to the through-hole depth variations, reduce the metal layer areas, avoid short-circuits, and improve the production yield.

The array substrate according to the present disclosure may occupy less metal layer area for the through-holes. By distributing the through-holes in different locations and electrically connecting the layout wiring in different metal layers together by through-holes, the utilization of the layout area may be maximized. Such wiring layout method may also have desired flexibility and simplicity. At the same time, the areas occupied by the pixel display region and/or peripheral region may still be very compact. The wiring layout method may also be desired for high PPI display panel designs and narrow bezel designs.

The array substrate according to the present disclosure may occupy less metal layer area for the through-holes. By distributing the through-holes in different locations and electrically connecting the layout wiring in different metal layers together by through-holes, the utilization of the layout area may be maximized. Such wiring layout method may also be desired for high PPI display panel designs.

The array substrate according to the present disclosure may reduce the layout space loss due to the through-hole depth variations. By separating the layout wiring in different metal layers and electrically connecting the layout wiring in different metal layers together by through-holes, the areas occupied by the pixel display region and/or peripheral region may still be very compact. The wiring layout method may also be desired for narrow bezel designs.

Various embodiments have been described to illustrate the operation principles and exemplary implementations. The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. An array substrate, comprising: a substrate; a first functional layer configured on one side of the substrate; a first insulating layer configured on the first functional layer facing away from the substrate; a second functional layer configured on the first insulating layer facing away from the substrate; a second insulating layer configured on the second functional layer facing away from the substrate; a third functional layer configured on the second insulating layer facing away from the substrate; a third insulating layer configured on the third functional layer facing away from the substrate; a fourth functional layer configured on the third insulating layer facing away from the substrate; a plurality of through-holes configured to electrically connect different functional layers, wherein a depth of any through-holes does not exceed the thickness of two adjacent insulating layers; and a plurality of pixel driving circuits, wherein a pixel driving circuit comprises a first transistor, wherein a semiconductor layer of the first transistor is located in the first functional layer, a gate electrode of the first transistor is located in the second functional layer, and a source electrode and a drain electrode of the first transistor are both located in the fourth functional layer.

2. The array substrate of claim 1, wherein:
the functional layers and the insulating layers are single layer structures or multi-layer structures including a plurality of sub-layers.

3. The array substrate of claim 1, wherein:
the first functional layer is made of semiconductor material; and
the second functional layer, the third functional layer, and the fourth functional layer are made of metal.

4. The array substrate of claim 1, wherein:
orthogonal projection centers of any two through-holes on the substrate do not coincide with each other.

5. The array substrate of claim 1, wherein:
the first insulating layer has a thickness of approximately 100 nm to 200 nm;
the second insulating layer has a thickness of approximately 50 nm to 150 nm; and
the third insulating layer has a thickness of approximately 200 nm to 700 nm.

6. The array substrate of claim 1, wherein:
the third functional layer includes a first conductive portion and a second conductive portion;
the through-holes include a first through-hole and a second through-hole that penetrate the first insulating layer and the second insulating layer, and a third through-hole and a fourth through-hole that penetrate the third insulating layer;
the source electrode of the first transistor is electrically connected to the first conductive portion by the third through-hole while the first conductive portion is electrically connected to the semiconductor layer of the first transistor by the first through-hole; and
the drain electrode of the first transistor is electrically connected to the second conductive portion by the fourth through-hole while the second conductive portion is electrically connected to the semiconductor layer of the first transistor by the second through-hole.

7. The array substrate of claim 6, further including a first capacitor and a fifth through-hole, wherein:
the fifth through-hole penetrates the second insulating layer and the third insulating layer;

a first electrode of the first capacitor is located in the second functional layer;

a second electrode of the first capacitor is located in the third functional layer; and the first electrode of the first capacitor is electrically connected to the drain electrode or the source electrode of the first transistor by the fifth through-hole.

8. The array substrate of claim 7, further including a sixth through-hole and a third conductive portion, wherein:
the sixth through-hole penetrates the third insulating layer;
the third conductive portion is located in the fourth functional layer; and
the second electrode of the first capacitor is electrically connected to the third conductive portion by the sixth through-hole.

9. The array substrate of claim 7, further including a seventh through-hole and a fourth conductive portion, wherein:
the seventh through-hole penetrates the second insulating layer;
the fourth conductive portion is located in the third functional layer; and
the first electrode of the first capacitor is electrically connected to the fourth conductive portion by the seventh through-hole.

10. The array substrate of claim 6, further including a second transistor and an eighth through-hole, wherein:
the eighth through-hole penetrates the second insulating layer and the third insulating layer;
a semiconductor layer of the second transistor is located in the first functional layer;
a gate electrode of the second transistor is located in the second functional layer;
a source electrode and a drain electrode of the second transistor are located in the fourth functional layer; and
the source electrode or the drain electrode of the first transistor is electrically connected to the gate electrode of the second transistor by the eighth through-hole.

11. The array substrate of claim 6, further including a third transistor, wherein:
a semiconductor layer of the third transistor is located in the first functional layer;
a gate electrode of the third transistor is located in the second functional layer; and
a source electrode and a drain electrode of the third transistor are located in the third functional layer.

12. The array substrate of claim 11, further including a ninth through-hole, wherein:
the ninth through-hole penetrates the second insulating layer and the third insulating layer; and
the source electrode or the drain electrode of the first transistor is electrically connected to the gate electrode of the third transistor by the ninth through-hole.

13. The array substrate of claim 11, further including a tenth through-hole and a fifth conductive portion, wherein:
the tenth through-hole penetrates the third insulating layer;
the fifth conductive portion is located in the fourth functional layer; and
the source electrode or the drain electrode of the third transistor is electrically connected to the fifth conductive portion by the tenth through-hole.

14. The array substrate of claim 11, further including an eleventh through-hole and a sixth conductive portion, wherein:
the eleventh through-hole penetrates the second insulating layer;
the sixth conductive portion is located in the second functional layer; and
the source electrode or the drain electrode of the third transistor is electrically connected to the sixth conductive portion by the eleventh through-hole.

15. A display panel, comprising an array substrate and a light emitting functional layer located on the array substrate, wherein the array substrate comprising: a substrate; a first functional layer configured on one side of the substrate; a first insulating layer configured on the first functional layer facing away from the substrate; a second functional layer configured on the first insulating layer facing away from the substrate; a second insulating layer configured on the second functional layer facing away from the substrate; a third functional layer configured on the second insulating layer facing away from the substrate; a third insulating layer configured on the third functional layer facing away from the substrate; a fourth functional layer configured on the third insulating layer facing away from the substrate; a plurality of through-holes configured to electrically connect different functional layers, wherein the depth of any through-holes does not exceed the thickness of two adjacent insulating layers; and a plurality of pixel driving circuits, wherein a pixel driving circuit comprises a first transistor, wherein a semiconductor layer of the first transistor is located in the first functional layer, a gate electrode of the first transistor is located in the second functional layer, and a source electrode and a drain electrode of the first transistor are both located in the fourth functional layer.

16. A display device, comprising a display panel which includes an array substrate and a light emitting functional layer located on the array substrate, wherein the array substrate comprising: a substrate; a first functional layer configured on one side of the substrate; a first insulating layer configured on the first functional layer facing away from the substrate; a second functional layer configured on the first insulating layer facing away from the substrate; a second insulating layer configured on the second functional layer facing away from the substrate; a third functional layer configured on the second insulating layer facing away from the substrate; a third insulating layer configured on the third functional layer facing away from the substrate; a fourth functional layer configured on the third insulating layer facing away from the substrate; a plurality of through-holes configured to electrically connect different functional layers, wherein the depth of any through-holes does not exceed the thickness of two adjacent insulating layers; and a plurality of pixel driving circuits, wherein a pixel driving circuit comprises a first transistor, wherein a semiconductor layer of the first transistor is located in the first functional layer, a gate electrode of the first transistor is located in the second functional layer, and a source electrode and a drain electrode of the first transistor are both located in the fourth functional layer.

* * * * *